(12) United States Patent
Chiu et al.

(10) Patent No.: US 8,939,721 B2
(45) Date of Patent: Jan. 27, 2015

(54) FAN ASSEMBLY

(75) Inventors: Po-Wen Chiu, New Taipei (TW);
Wen-Hu Lu, Shenzhen (CN);
Zhan-Yang Li, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 677 days.

(21) Appl. No.: 13/299,423

(22) Filed: Nov. 18, 2011

(65) Prior Publication Data

US 2012/0163971 A1 Jun. 28, 2012

(30) Foreign Application Priority Data

Dec. 24, 2010 (CN) .......................... 2010 1 0604473

(51) Int. Cl.
*F04D 29/64* (2006.01)
*H05K 7/20* (2006.01)
*F04D 29/60* (2006.01)
*G06F 1/20* (2006.01)
*F04D 29/52* (2006.01)

(52) U.S. Cl.
CPC .......... *H05K 7/20172* (2013.01); *F04D 29/601* (2013.01); *G06F 1/20* (2013.01); *F04D 29/522* (2013.01)

USPC ........................................................ 415/213.1

(58) Field of Classification Search
None
See application file for complete search history.

(56) References Cited

U.S. PATENT DOCUMENTS

2003/0035724 A1* 2/2003 Chen et al. ................. 415/213.1

* cited by examiner

*Primary Examiner* — Richard Edgar
(74) *Attorney, Agent, or Firm* — Novak Druce Connolly Bove + Quigg LLP

(57) ABSTRACT

A fan assembly used in an electronic device is disclosed. The fan assembly includes a fan and the casing securing the fan. The casing includes a top plate, a front plate, a rear plate and two side plates. The top plate comprises a plurality of mounting pieces and a mounting portion located on each mounting piece. The front plate is secured to the fan. The rear plate is secured to the fan and opposite to the front plate. The two side plates are secured to the front plate and the rear plate. Each side plate comprises two positioning pieces, and each positioning piece defines a positioning hole. The plurality of mounting pieces abuts the two positioning pieces of the two side plates, and the mounting piece is engaged in the positioning hole.

20 Claims, 4 Drawing Sheets

FAN ASSEMBLY

BACKGROUND

1. Technical Field

The present disclosure relates to fan assemblies, and particularly to a fan assembly used in an electronic device.

2. Description of Related Art

Fan assemblies are used for cooling electronic devices, such as a computer or a server. The fan assembly includes a fan and a casing for securing the fan. The casing is secured to the electronic device. It is inconvenient to replace or upgrade the fan as the fan is often attached to the casing with screws.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
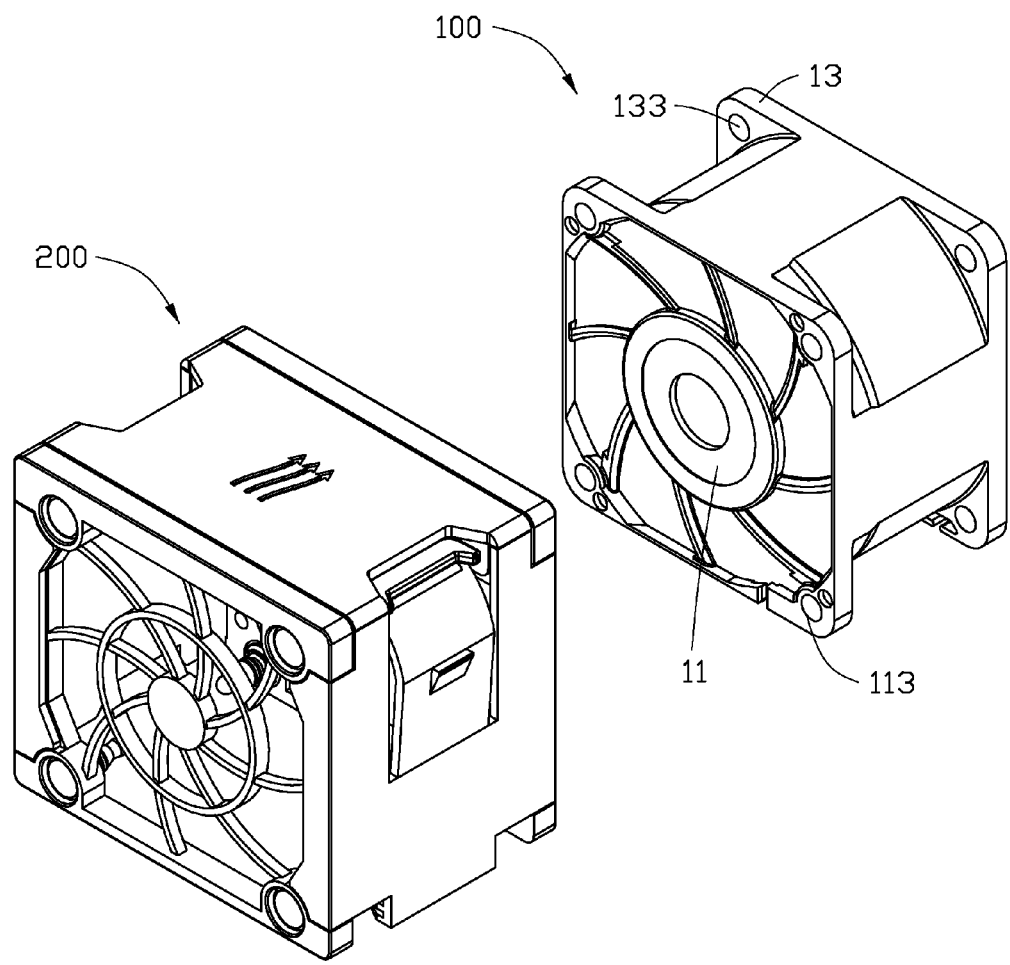
FIG. 1 is an exploded, isometric view of a fan and a casing of a fan assembly in accordance with one embodiment.

Referring to FIG. 1, one embodiment of a fan assembly includes a fan 100 and a casing 200.

The fan 100 includes a front board 11 and rear board 13 opposite to the front board 11. Each corner of the front board 11 defines a first hole 113. Each corner of the rear board 13 defines a second hole 133.

Figure 2:
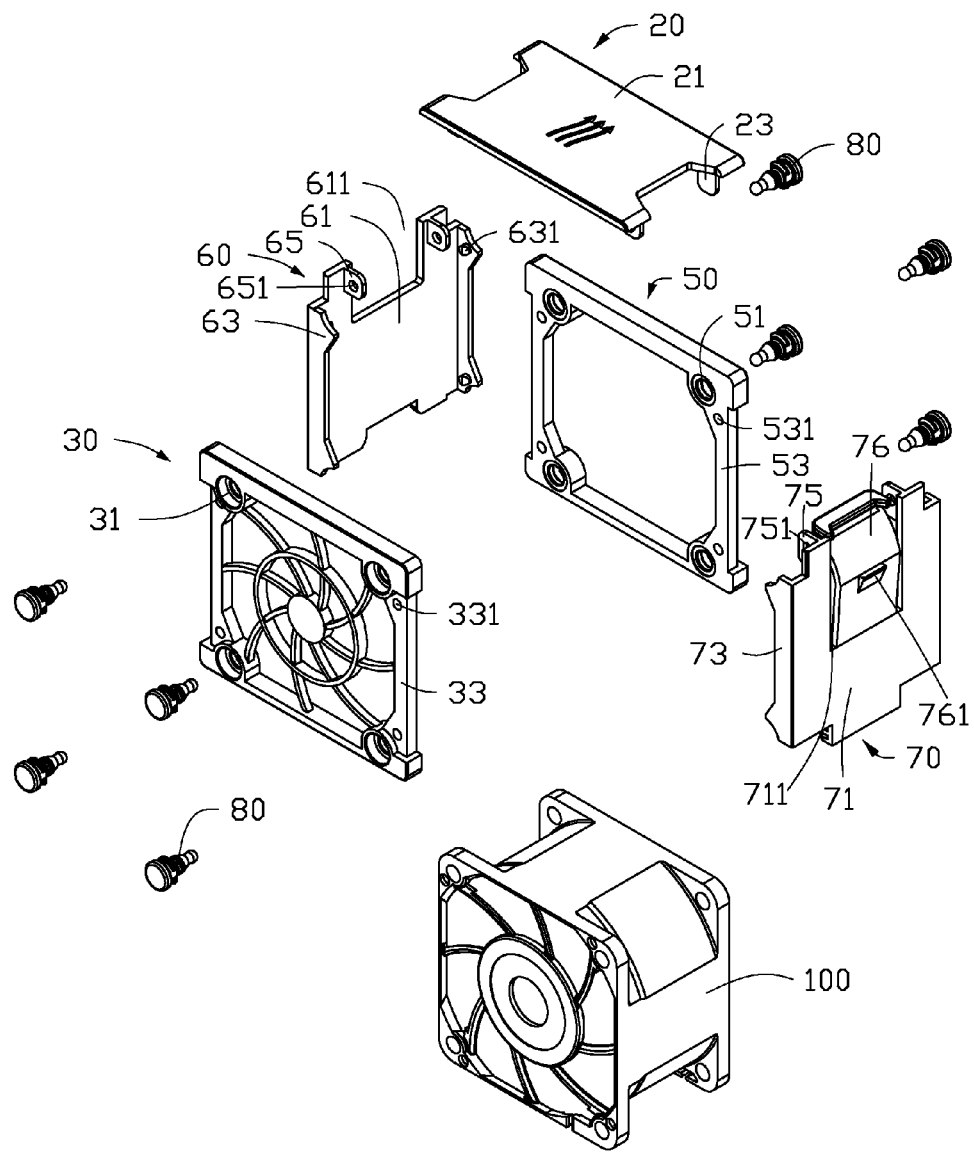
FIG. 2 is an exploded, isometric view of the fan assembly of FIG. 1.

Referring to FIG. 2, the casing 200 includes a top plate 20, a front plate 30, a rear plate 50 opposite to the front plate 30, a first side plate 60 and a second side plate 70.

The top plate 20 includes a body 21 and a plurality of mounting pieces 23. Each of the plurality of mounting pieces 23 extends downwards from a corner of the body 21. A mounting portion 231 protrudes from each of the plurality of mounting pieces 23 (shown in FIG. 3). In one embodiment, the plurality of mounting pieces 23 are substantially perpendicular to the body 21.

Each corner of the front plate 30 defines a first locking hole 31 corresponding to the first hole 113. A first recess portion 33 is defined in each side of the front plate 30. Each first recess portion 33 defines two first receiving holes 331. In one embodiment, the first recess portion 33 is substantially L shaped.

Each corner of the rear plate 50 defines a second locking hole 51 corresponding to the first locking hole 31. A second recess portion 53 is defined in each side of the rear plate 50 corresponding to the first recess portion 33. Each second recess portion 53 defines two second receiving holes 531. In one embodiment, the second recess portion 53 is substantially L shaped.

The first side plate 60 includes a first body 61, two first positioning plates 63, and two first positioning pieces 65. Two first positioning portions 631 protrude from each of the two first positioning plates 63. The first body 61 defines a first cutout 611. Each of the two first positioning pieces 65 is adjacent to a side edge of the first cutout 611 and is substantially parallel to the two first positioning plates 63. Each of the two first positioning pieces 65 defines a first positioning hole 651.

The second side plate 70 includes a second body 71, two second positioning plates 73, two second positioning pieces 75, and a resilient operating plate 76. The second positioning plate 73 is similar to the first positioning plate 63. A second positioning portion (not shown) protrudes from each of the two second positioning plates 73 and is similar to the first positioning portion 631. Each of the two second positioning plates 73 extends from each side edge of the second body 71 and is substantially perpendicular to the second body 71. The second body 71 defines a second cutout 711. Each of the two second positioning pieces 75 is adjacent to a side edge of the second cutout 711 and is substantially parallel to the two second positioning plates 73. Each of the two second pieces 75 defines a second positioning hole 751. The resilient operating plate 76 extends from a bottom edge of the second cutout 711 and is located in the cutout 711. A latching portion 761 protrudes from the resilient operating plate 76. The resilient operating plate 76 is elastically deformable to bias the latching portion 761 to engage with a mounting frame (not shown) when the fan assembly is secured to the mounting frame.

Figure 3:
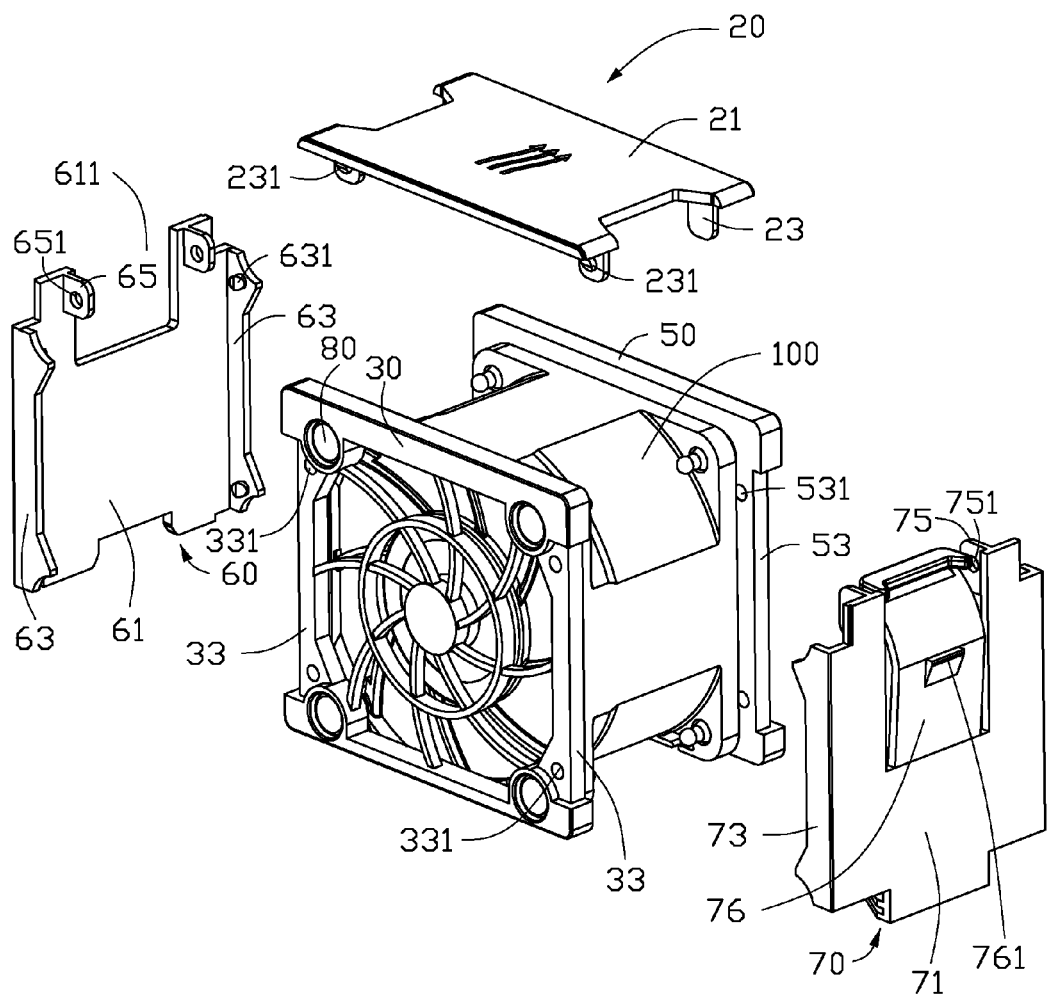
FIG. 3 is similar to the fan assembly of FIG. 2, but with a front plate and rear plate secured to the fan.

Referring to FIG. 3, in assembly, a plurality of locking members 80 are inserted into the first locking holes 31 and the first holes 113 to secure the front plate 30 to the front board 11 of the fan 100. In one embodiment, each of the plurality of locking members 80 is a shock-absorbing screw. The rear plate 50 is secured to the rear board 13 of the fan 100 with the plurality of locking members 80 inserted into the second locking holes 51 and the second holes 133.

Figure 4:
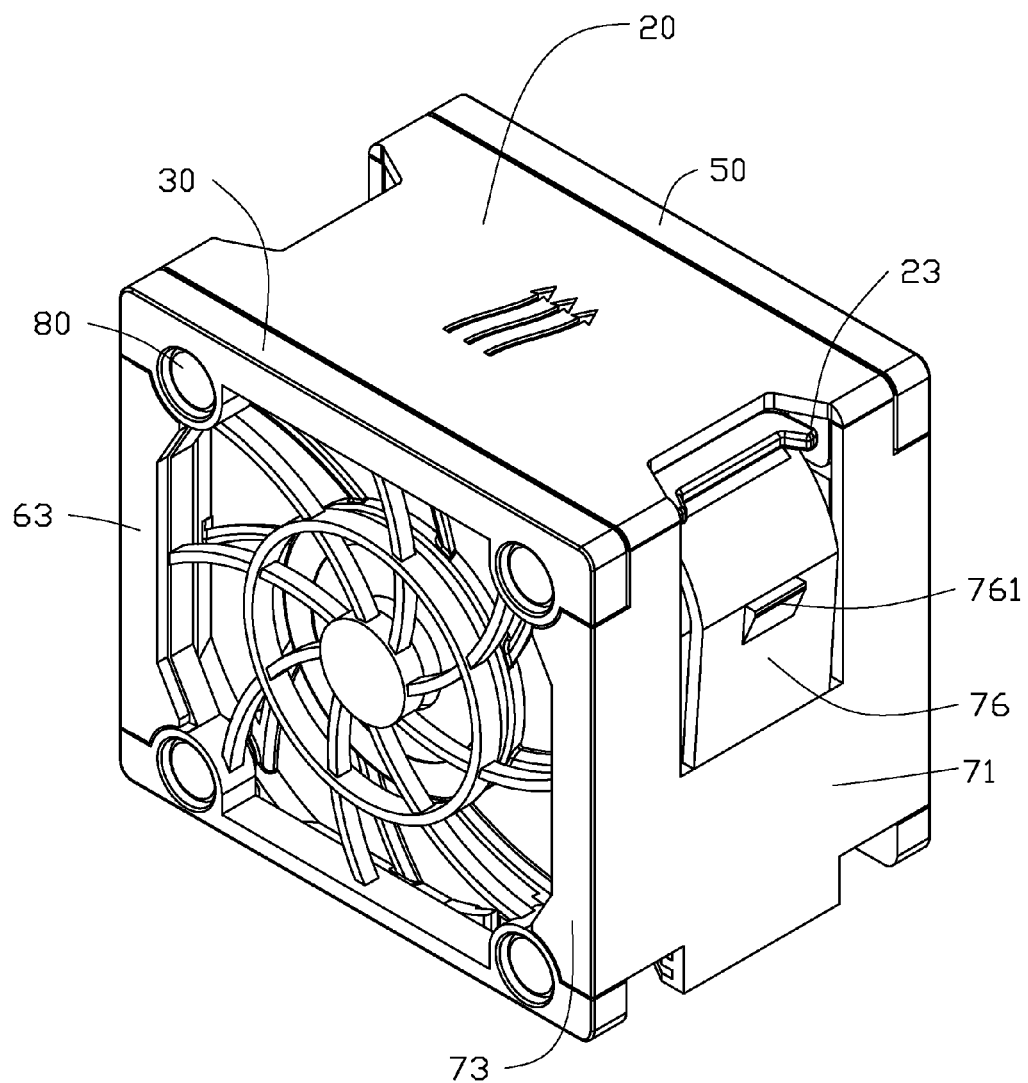
FIG. 4 is an assembly, isometric view of the fan assembly of FIG. 2.

Referring to FIG. 4, the first side plate 60 is moved towards a first side of the fan 100. One first positioning plate 63 is placed into the first recess portion 33 of the first side. The first positioning portions 631 of the one first positioning plate 63 are engaged in the two first receiving holes 331. The first side plate 60 is pressed to elastically deform the other first positioning plate 63, until the first positioning portions 631 of the other first positioning plate 63 are aligned with the two second receiving holes 531 of the first side. The other first positioning plate 63 elastically rebounds to engage the first positioning portions 631 in the two second receiving holes 531 of the first side, and the other first positioning plate 63 is received in the second recess portion 53 of the first side. The first side plate 60 is secured to the fan 100.

The second side plate 70 is secured to a second side of the fan 100 opposite to the first side. One second positioning plate 73 is received in the first recess portion 33 of the second side. The other second positioning plate 73 is received in the second recess portion 53 of the second side. The second positioning portions are engaged in the first receiving holes 331 and the second receiving holes 531 of the second side. The second side plate 70 is secured to the fan 100, and the first body 61 is substantially parallel to the second body 71.

In assembly of the top plate 20, the top plate 20 is moved towards the top portion of the fan 100 until the plurality of mounting pieces 23 are blocked by the two first positioning pieces 65 and the two second positioning pieces 75. The top plate 20 is further driven to move downwards, the plurality of mounting pieces 23 are elastically deformed until the mounting portions 231 are aligned with the first positioning holes 651 and the second positioning holes 751. The plurality of mounting pieces 23 elastically rebound to engage the mounting portions 231 to the first positioning holes 651 and the second positioning holes 751. The top plate 20 is secured to the first side plate 60 and the second side plate 70. The first body 61 and the second body 71 are substantially perpendicular to the body 21.

In disassembly, the top plate 20 is driven to move upwards, the plurality of mounting pieces 23 are elastically deformed to disengage the mounting portions 231 from the first positioning holes 651 and the second positioning holes 751, then the top plate 20 can be removed from the fan 100. The first side plate 60 and the second side plate 70 are driven to move outwards, and the two first positioning plates 63 and the two second positioning plates 73 are elastically deformed. The first positioning portions 631 and the second positioning portions are disengaged from the first receiving holes 331 and the second receiving holes 531. Then the first side plate 60 and the second side plate 70 can be removed from the fan 100.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A fan assembly comprising:
   a fan; and
   a casing receiving the fan therein and comprising:
   a top plate comprising two mounting portions;
   two side plates, and each of the two side plates comprising two first positioning portions and defining a positioning hole;
   a front plate secured to a front surface of the fan, and each of a first side of the front plate and a second side of the front plate defining a first receiving hole; and
   a rear plate secured to a rear surface of the fan opposite to the front surface, and each of a first side of the rear plate and a second side of the rear plate defining a second receiving hole;
   wherein the two first positioning portions of one of the two side plates are engaged in the first receiving hole of the first side of the front plate and the second receiving hole of the first side of the rear plate; the two first positioning portions of another of the two side plates are engaged in the first receiving hole of the second side of the front plate and the second receiving hole of the second side of the rear plate; and each of the two mounting portions is engaged in the positioning hole of each of the two side plates.

2. The fan assembly of claim 1, wherein each of the first side and the second of side the front plate defines a first recess portion, each of the first side and the second side of the rear plate defines a second recess portion; the first receiving hole is in the first recess portion, and the second receiving hole is in the second recess portion.

3. The fan assembly of claim 2, wherein each of the two side plates comprises two positioning plates, each of the two first positioning portions is on each of the two positioning plates; each of the two positioning plates are received in each of the first recess portion and the second recess portion.

4. The fan assembly of claim 3, wherein the top plate further comprises two mounting pieces, the two mounting portions are located on the two mounting pieces; each of the two positioning plates comprises two positioning pieces, and the positioning hole is defined in each of the two positioning pieces.

5. The fan assembly of claim 4, wherein the two mounting pieces are between the two positioning pieces, and each of the two mounting pieces abuts each of the two positioning pieces.

6. The fan assembly of claim 4, wherein the two positioning pieces are substantially parallel to the two positioning plates.

7. The fan assembly of claim 4, wherein the top plate comprises a first body, each of the two side plate comprises a second body; the first body, the second body, the front plate, and the rear plate cover the fan, and the first body is substantially perpendicular to the second body.

8. The fan assembly of claim 7, wherein the two mounting pieces extend from the first body and are substantially perpendicular to the first body; the two positioning pieces and the two positioning plates extend from the second body and are substantially perpendicular to the second body.

9. The fan assembly of claim 1, wherein one of the two side plates comprises a resilient operating plate, a latching portion is on the resilient operating plate, and the resilient operating plate is operable to engage the latching portion to a fan mounting frame.

10. The fan assembly of claim 1, wherein the front plate and the rear plate are secured to the fan with a plurality of shake-absorbing screws.

11. A fan assembly comprising:
    a fan; and
    a casing securing the fan therein and comprising:
    a top plate comprising a plurality of mounting pieces and a mounting portion located on each of the plurality of mounting pieces;
    a front plate secured to a front surface of the fan;
    a rear plate secured to a rear surface of the fan opposite to the front surface; and
    two side plates secured to the front plate and the rear plate, each of the two side plates comprising two positioning pieces, and each of the two positioning pieces defining a positioning hole;
    wherein the plurality of mounting pieces abut the two positioning pieces of the two side plates, and the mounting portion of each of the plurality of the mounting pieces is engaged in the positioning hole.

12. The fan assembly of claim 11, wherein each of two opposite sides of the front plate and the rear plate defines a recess portion, each of the two side plates comprises two positioning plates, and each of the two positioning plates is received in each of the recess portion.

13. The fan assembly of claim 12, wherein each of the two side plates further comprises a positioning portion on each of the two positioning plates, the recess portion defines a receiving hole, and the positioning portion is engaged in the receiving hole.

14. The fan assembly of claim 12, the two positioning pieces are substantially parallel to the two positioning plates.

15. The fan assembly of claim 12, wherein the top plate comprises a first body, each of the two side plates comprises a second body; the first body, the second body, the front plate, and the rear plate cover the fan, and the first body is substantially perpendicular to the second body.

16. The fan assembly of claim 15, wherein the plurality of mounting pieces extend from the first body and are substantially perpendicular to the first body.

17. The fan assembly of claim 15, wherein the two positioning pieces and the two positioning plates extend from the second body and are substantially perpendicular to the second body.

18. The fan assembly of claim 11, wherein one of the two side plates comprises a resilient operating plate, a latching portion is located on the resilient operating plate, and the resilient operating plate is operable to engage the latching portion to a fan mounting frame.

19. The fan assembly of claim 11, wherein two of the plurality of mounting pieces are located between the two positioning pieces.

20. The fan assembly of claim 11, wherein the front plate and the rear plate are secured to the fan with a plurality of shake-absorbing screws.

\* \* \* \* \*